June 1, 1971 J. W. LATHROP 3,581,385
METHOD FOR FABRICATING LARGE SCALE INTEGRATED
CIRCUITS WITH DISCRETIONARY WIRING
Filed Oct. 4, 1967

INVENTOR
JAY W. LATHROP

E. Manley Hubbard
ATTORNEY

United States Patent Office 3,581,385
Patented June 1, 1971

3,581,385
METHOD FOR FABRICATING LARGE SCALE INTEGRATED CIRCUITS WITH DISCRETIONARY WIRING

Jay W. Lathrop, Dallas, Tex., assignor to Texas Instruments Incorporated, Dallas, Tex.

Filed Oct. 4, 1967, Ser. No. 672,851
Int. Cl. B01j 17/00; H01l 7/00
U.S. Cl. 29—574 6 Claims

ABSTRACT OF THE DISCLOSURE

A method for producing a large scale integrated circuit array with discretionary wiring by determining the distortion in the rectangular pattern produced by a computer controlled cathode ray tube, producing an array of integrated circuits on a single semiconductor slice in which the circuits are disposed in a correspondingly distorted pattern, testing the circuits in situ to determine the operative circuits, producing a photomask by means of the cathode ray tube, defining the wiring needed to interconnect the operative circuits into the desired system, and patterning a metal film by means of the photomask.

This invention relates generally to semiconductor devices, and more particularly relates to a method for fabricating large scale arrays of integrated circuit units on a single slice of semiconductor material which are interconnected into a system by at least one level of discretionary wiring formed by a patterned metal film.

A semiconductor device, such as a transistor, is usually fabricated by a series of diffusion steps. Each diffusion step involves applying a coat of photosensitive polymer, known as photoresist, over a silicon dioxide layer on the surface of the semiconductor substrate. A photomask is pressed against the surface of the photo-resist and the photo-resist exposed to light. When the photo-resist is photographically developed, selected areas of the photo-resist are removed to expose the underlying silicon dioxide. The exposed silicon dioxide is then removed by an etching fluid which does not attack the photo-resist to expose the underlying semiconductor material. The photo-resist is then stripped from the silicon dioxide and impurities diffused into the areas of the semiconductor material exposed by the openings in the silicon dioxide layer. A new silicon dioxide layer is either grown over the exposed portion of the semiconductor material during the diffusion process, or is subsequently deposited, and the procedure repeated for the next diffusion step.

Semiconductor material is more easily grown, handled and processed as disk-shaped slices having a nominal diameter of from about 1.5 inches to about 3.0 inches and a thickness of about ten milli-inches. For this reason, a large number of semiconductor devices are typically fabricated simultaneously on each slice by the same process steps. It is also common practice to fabricate semiconductors, diodes, resistors, and capacitors for a complete circuit on the same semiconductor substrate, and then interconnect the components by leads patterned from a metal film deposited on the surface of a silicon dioxide layer by a similar photolithographic process. Openings are provided in the oxide layer where the metal leads must make contact with the individual active components. The fabrication of integrated circuits usually requires a larger number of diffusion steps, and thus a larger number of photomasks for the diffusion steps, and in addition requires an extra photomask to pattern the metal film to form the interconnecting leads. It is also common practice to simultaneously fabricate a large number of integrated circuits on each individual slice of semiconductor material by the same process steps. The individual components or individual integrated circuit units are then usually separated and individually packaged.

Integrated circuits are widely used as the storage elements and as the logic gates for digital computers and automated control systems. As a result, large numbers of the individually packaged integrated circuits are often interconnected by printed circuits, or other similar techniques, into a large system. In the last few years, yields have increased to the point where it is practical to fabricate a large number of integrated circuits on a single slice of semiconductor material, test the circuits in situ on the slice, and then interconnect only the good circuits into an array by one or more levels of thin film leads deposited over the slice. However, as many as from one-fourth to one-third of the circuits on a slice may be faulty, and the faulty circuits occur at random positions on the slice. This means that a very large number of different combinations of good circuits can result.

These arrays are commonly referred to as large scale integrated (LSI) circuits. In order to produce LSI circuits on an economical basis, a customized photomask, or set of photomasks, must be generated to pattern one or more thin metal films and form the leads which interconnect the operative devices into the desired logic system. This would be highly impractical using conventional techniques. However, the discretionary wiring photomasks can be generated by means of a cathode ray tube controlled by a digital computer. In such a system, the coordinate positions of the operative integrated circuits are fed into the computer which then computes the wiring necessary to interconnect the operative devices into the desired system. The computer then controls the cathode ray tube in a manner to trace the necessary pattern on photographic film. Because the beam is generated at a point source and is projected onto a flat film, and because of inherent distortion in even a high resolution cathode ray tube as discused in the paper entitled "Mathematical Techniques to Improve Hardware Accuracy of Graphic Display Devices" presented by Cloy J. Walter at the Spring Joint Computer Conference, 1967, a rectangular pattern defined by coordinate deflection voltages is distorted more than can be tolerated if the photomask is to register with the regular rectangular array of integrated circuit units fabricated using conventional high resolution techniques. Extremely sophisticated and expensive electronic circuits are required to eliminate this distortion.

In accordance with the method of this invention, a large scale array of integrated circuit units is fabricated by first determining the distortion in the scanning pattern generated by a computer controlled cathode ray tube. Then an array of integrated circuit units is fabricated on a single semiconductor slice in which the metallized contacts for the individual integrated ciricuit units, and more particularly the circuit units, are disposed generally in a pattern which is distorted to conform to the distortion in the scanning pattern of the cathode ray tube. The integrated circuit units are then individually tested in situ to determine which of the units are operative and a photomask generated by means of the computer controlled cathode ray tube. Finally, a metal film is deposited over the slice and patterned by a photolithographic process using the photomask to form leads interconnecting the operative integrated ciricuit units into a common logic system.

The novel features believed characteristic of this invention are set forth in the appended claims. The invention itself, however, as well as other objects and advantages thereof, may best be understood by reference to the following detailed description of an illustrative embodiment, when read in conjunction with the accompanying drawings, wherein:

Figure 1:
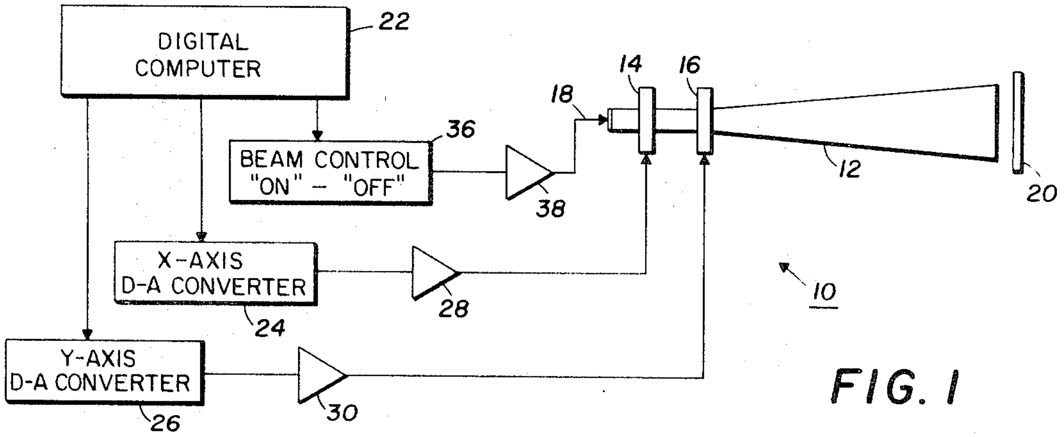
FIG. 1 is a schematic circuit diagram of a computer controlled cathode ray tube for producing a photomask in accordance with the present invention.

Referring now to the drawings, and in particular to FIG. 1, a system for generating photomasks for the discretionary wiring of large scale integrated circuits is indicated generally by the reference numeral 10. The system 10 is comprised of a conventional high resolution cathode ray tube 12 having conventional X and Y deflection means represented at 14 and 16, respectively. The beam of the tube 12 may be turned "on" and "off" by the input represented schematically at 18. A photographic film 20 is positioned adjacent the face of the cathode ray tube 12 so as to be exposed by the image of the light spot on the tube which may be projected through a lens system if desired. The film 20 may be a portion of a roll of flexible film, or may be the conventional type used for producing photomasks which is typically a glass plate about four inches square having an optically flat face coated with a high resolution photographic emulsion.

The cathode ray tube 12 is operated by a digital computer represented at 22. The digital computer 22 controls the deflection of the beam of the cathode ray tube 12 by an interfacing system including X-axis and Y-axis digital-to-analog converters 24 and 26 and amplifiers 28 and 30 which drive the X and Y deflection coils 14 and 16, respectively. The beam of the cathode ray tube is successively positioned so as to produce overlapping spots on the film plate 20, a pattern which can completely expose the film. Each spot can be defined by an X and Y voltage produced by the digital-to-analog converters 24 and 26. The beam is successively stepped to each of the spot positions for the period of time required to expose the plate 20 in a predetermined sequence by controlling the output of the digital-to-analog converters with the computer 22. The computer 22 can turn the beam either on or off through interfacing ciricuit 32 and amplifier 34 at each spot position in order to expose the film 20 in the desired pattern.

Figure 2:
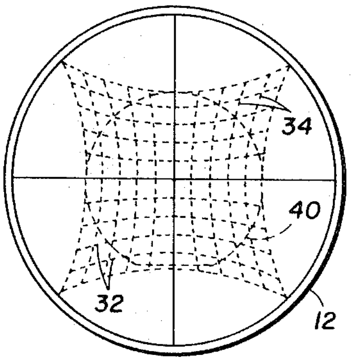
FIG. 2 is a schematic diagram illustrating the normal distortion of the scanning pattern of the cathode ray tube of FIG. 1.

Thus, each discrete position of the beam, and therefore each of the overlapping exposure spots on the film 20 may be defined by an X and Y coordinate, and in turn may be defined by the voltages produced by the X-axis and Y-axis digital-to-analog converters. Since the photographic film has a flat surface upon which the emulsion is located, and the beam of the cathode ray tube originates at a point, the X and Y coordinate patterns resulting on the plate 20 would be distorted as illustrated in FIG. 2 if the X and Y deflection voltages are linear. The degree of distortion is greatly amplified in FIG. 2 for purposes of illustration. The generally horizontally extending dotted lines 32 represent the points to which the beam is deflected by constant Y-axis deflection voltages and the generally vertically extending dotted lines 34 represent the points resulting from constant X-axis deflection voltages. It will be noted that the distortion increases in both the X and Y coordinate directions as the spot moves away from the X and Y axes. The distortion due to the optically flat photographic plate 20 can, of course, be calculated. However, additional distortion of the same type also results from the electronic ciricuitry used to operate the cathode ray tube and deflect the beam. This latter distortion varies with each system, and also tends to vary for each system over a period of time. Very complex and expensive circuitry is required to remove this distortion electronically.

Figure 3:
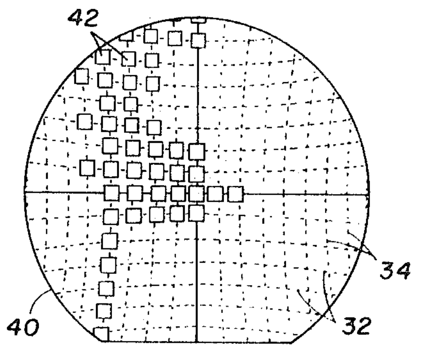
FIG. 3 is a simplified schematic diagram of an array of semiconductor devices fabricated in accordance with the present invention.

In accordance with this invention, the distortion produced by a particular computer operated cathode ray tube system 10 illustrated in FIG. 1 is first determined, then the conventional rectangular coordinate pattern of integrated ciricuit units on the semiconductor slice is purposely distorted to conform to the distorted coordinate pattern produced by the cathode ray tube. Such an array of semiconductor units is indicated generally by the reference numeral 40 in the schematic drawing of FIG. 3. In the array 40, each integrated circuit unit 42 is of convcentional design but is centered on X and Y coordinate lines which are distorted to correspond generally to the equal deflection voltage lines 32 and 34 of the cathode ray tube pattern of FIG. 2. The individual circuit units are not distorted, but instead like units are the same size and shape regardless of the position of the unit on the slice.

The array 40 is produced by conventional processing techniques using a set of photomasks in which the basic pattern relating to each integrated circuit unit is displaced from the normal rectangular coordinate position by the same amount that the beam of the cathode ray tube is displaced from the coordinate position defined by the computer 22 when attempting to position the beam at the normal rectangular coordinate position. Such a set of photomasks can be produced using a step and repeat camera. A step and repeat camera which is particularly suited to produce such masks is described in detail in copending U.S. application Ser. No. 680,291, entitled "Step and Repeat Camera With Computer Controlled Film Table," filed on Oct. 18,1967 on behalf of Ables et al., and assigned to the assignee of the present invention, now Pat. No. 3,498,711. The step and repeat camera described in that application positions the basic pattern on each photomask relating to each integrated circuit unit with a precision on the order of a few microinches. This is achieved by supporting the film on a movable table and stepping the table to the succesive exposure positions by means of a servo loop comprised of an interferometer system for detecting the position of the table, and a digital computer which computes each exposure position, detects the current position of the table, and then operates a servo drive system in such a manner to move the table to the exposure position and maintain the table at the exposure position during each exposure.

After the array of integrated circuit units 40 is fabricated, including the first metal layer used to interconnect the individual components into each operative circuit unit, the circuit units are individually tested in situ and a record kept of the X and Y coordinate locations of the operative units. The coordinate locations of the operative units are then fed into the digital computer 22 together with the necessary related information necessary to determine the optimum lead pattern necesary to interconnect the expanded contacts of the individual units into a common system or set of subsystems. The computer 22 then computes the profile of the wiring necessary to interconnect the expanded contacts of the operative integrated circuit units to form a composite system with the desired functions.

The computer 22 then steps the beam of the cathode ray tube 12 through all of the coordinate positions necessary to completely expose the photographic plate 20, but turns the beam "on" only at those coordinate positions which must be exposed in order to produce the desired lead pattern. This procedure results in a photomask which defines a lead pattern having the general appearance illustrated in FIG. 4. The actual photomask may be either transparent or opaque in this pattern, depending upon the type of photo-resist used. The pattern illustrated shows the areas of the metallized film which is to be retained in order to form the interconnecting leads. It will be noted that the interconnecting leads 44 follow generally the contours of the constant Y deflection voltage lines 34 and the expanded contact areas 46 which would overlie the expanded contacts of the operative units lie generally along the constant X deflection voltage lines 34.

Figure 4:
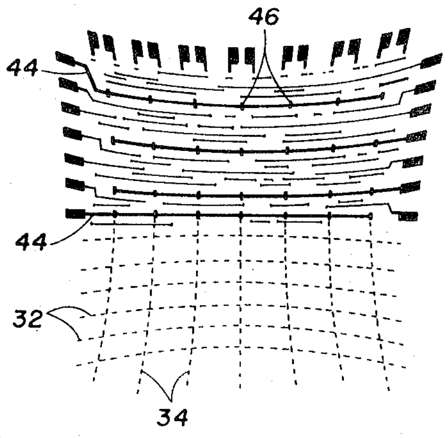
FIG. 4 is a simplified schematic drawing of a photomask produced in accordance with the present invention.

The circuits on the slice 40 are then interconnected by depositing a metallized layer over the entire slice, coating the metal layer with a layer of photo-resist, exposing the photo-resist through the mask shown in FIG. 4, developing the photo-resist to remove the photo-resist in areas where the metal film is to be removed, and then subjecting the slice to an etchant which attacks the metal film but does not remove the photo-resist. This leaves metal leads in the same pattern as shown in FIG. 4. These leads extend through openings in the final insulating layer formed over the slice and into contact with the underlying expanded metal contacts of the operative integrated circuit units to interconnect the individual integrated circuit units into a common system. If necessary, more than one layer of interconnecting leads may be formed in the same manner.

Although preferred embodiments of the invention have been described in detail, it is to be understood that various changes, substitutions and alterations can be made therein without departing from the spirit and scope of the invention as defined by the appended claims.

What is claimed is:

1. The method for producing a large scale array of integrated circuit units having at least one level of discretionary wiring interconnecting the units which comprises:

determining the distortion in the coordinate pattern generated by a computer controlled cathode ray tube, producing an array of integrated circuit units on a single semiconductor slice having metallized contacts disposed generally in a coordinate pattern that is distorted to conform to the distortion of the coordinate pattern produced by the cathode ray tube, testing the integrated circuit units of the array in situ to determine which of the units are operative, generating a photomask by means of the computer controlled cathode ray tube for patterning a layer of wiring on the surface of the slice to produce discretionary wiring interconnecting the operative integrated circuit units, and then producing a level of wiring interconnecting the operative integrated circuit units by means of the photomask generated by the computer controlled cathode ray tube.

2. The method of producing a large scale array of integrated circuit units having at least one level of discretionary wiring interconnecting the units which comprises:

determining the distortion in the coordinate pattern generated by a computer controlled cathode ray tube, generating a set of photomasks for producing an array of integrated circuit units, producing an array of integrated circuit units on a single semiconductor slice, said units having metallized contacts disposed generally in a coordinate pattern that is distorted to conform to the distortion of the coordinate pattern produced by the cathode ray tube, testing the integrated circuit units of the array in situ to determine which of the units are operative, generating a photomask by means of the computer controlled cathode ray tube for patterning a layer of wiring on the surface of the slice to produce discretionary wiring interconnecting the operative integrated circuit units, and then producing a level of wiring interconnecting the operative intgerated circuit units by means of the photomask generated by the computer controlled cathode ray tube.

3. The method of producing a large scale array of integrated circuit units having at least one level of discretionary wiring interconnecting the units which comprises:

determining the distortion in the coordinate pattern generated by a computer controlled cathode ray tube, producing an array of integrated circuit units on a single semiconductor slice having metallized contacts disposed generally in a coordinate pattern that is distorted to conform to the distortion of the coordinate pattern produced by the cathode ray tube, testing the integrated circuit units of the array in situ to determine which of the units are operative, and then generating a photomask by means of the computer controlled cathode ray tube for patterning a layer of wiring on the surface of the slice to produce discretionary wiring interconnecting the operative integrated circuit units.

4. The method for producing a large scale array of integrated circuit units having at least one level of discretionary wiring interconnecting the units which comprises:

determining the distortion in the coordinate pattern generated by a computer controlled cathode ray tube, generating a photomask for producing the large scale array by a step and repeat camera in which the exposures are made in a coordinate pattern distorted to conform to the distortion in the coordinate pattern produced by the computer controlled cathode ray tube, producing an array of integrated circuit units on a single semiconductor slice having metallized contacts disposed generally in a coordinate pattern that is distorted to conform to the distortion of the coordinate pattern produced by the cathode ray tube, testing the integrated circuit units of the array in situ to determine which of the units are oeprative, and then generating a photomask by means of the computer controlled cathode ray tube for patterning a layer of wiring on the surface of the slice to produce discretionary wiring interconnecting the operative integrated circuit units.

5. The method for producing a large scale array of integrated circuit units having at least one level of discretionary wiring interconnecting the units which comprises:

determining the distortion in the coordinate pattern generated by a computer controlled cathode ray tube, generating a photomask for producing the large scale array by a step and repeat camera in which the exposures are made in a coordinate pattern distorted to conform to the distortion of the coordinate pattern produced by the cathode ray tube, producing an array of integrated circuit units on a single semiconductor slice having metallized contacts disposed generally in a coordinate pattern that is distorted to conform to the distortion of the coordinate pattern produced by the cathode ray tube, testing the integrated circuit units of the array in situ to determine which of the units are operative.

generating a photomask by means of the computer controlled cathode ray tube for patterning a layer of wiring on the surface of the slice to produce discretionary wiring interconnecting the operative integrated circuit units, and then producing a level of wiring interconnecting the operative integrated circuits units by means of the photomask generated by the computer controlled cathode ray tube.

6. The method of producing a large scale array of integrated circuit units having at least one level of discretionary wiring interconnecting the units which comprises:

determining the distortion in the coordinate pattern generated by a computer controlled cathode ray tube, generating a set of photomasks for producing an array of integrated circuits units, producing an array of integrated circuit units on a single semiconductor slice, said units having metallized contacts disposed generally in a coordinate pattern that is distorted to conform to the distortion of the coordinate pattern produced by the cathode ray tube, testing the integrated circuit units of the array in situ to determine which of the units are operative, and then generating a photomask by means of the computer controlled cathode ray tube for patterning a layer of wiring on the surface of the slice to produce discretionary wiring interconnecting the operative integrated circuit units.

References Cited

UNITED STATES PATENTS

| | | | |
|---|---|---|---|
| 2,982,002 | 5/1961 | Shockley | 29—574 |
| 2,994,121 | 8/1961 | Shockley. | |
| 3,218,613 | 11/1965 | Gribble et al. | 340—173 |
| 3,312,871 | 4/1967 | Seki et al. | 317—101 |
| 3,377,513 | 4/1968 | Ashby et al. | 317—101 |
| 3,423,822 | 1/1969 | Davidson et al. | 29—574 |

JOHN F. CAMPBELL, Primary Examiner

W. TUPMAN, Assistant Examiner

U.S. Cl. X.R.

29—577; 96—36.2; 317—101